US007252553B2

United States Patent
Morello et al.

(10) Patent No.: US 7,252,553 B2
(45) Date of Patent: Aug. 7, 2007

(54) RING OUT SYSTEM PROVIDING TERMINAL POSITION ASSURANCE

(75) Inventors: John R. Morello, Warren, OH (US); Charles L Flask, Warren, OH (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/261,697

(22) Filed: Oct. 28, 2005

(65) Prior Publication Data
US 2007/0099516 A1    May 3, 2007

(51) Int. Cl.
*H01R 24/04* (2006.01)
(52) U.S. Cl. ..................................... 439/668
(58) Field of Classification Search ............... 439/668, 439/489–490, 66, 700, 71, 91, 862
See application file for complete search history.

(56) References Cited

U.S. PATENT DOCUMENTS

| 5,863,216 | A  | * | 1/1999  | Tsuji et al. | 439/489 |
| 6,506,069 | B2 | * | 1/2003  | Babala et al. | 439/248 |
| 6,506,082 | B1 | * | 1/2003  | Meek et al. | 439/700 |
| 6,666,691 | B2 | * | 12/2003 | Ikeya | 439/71 |
| 6,955,572 | B1 | * | 10/2005 | Howell | 439/862 |

* cited by examiner

*Primary Examiner*—J. F. Duverne
(74) *Attorney, Agent, or Firm*—David P. Wood (57) ABSTRACT

A ring out system including a ring out holder and an electrical connector to be tested therewith. The holder has a plurality of ring out pins which are received into openings at the floor of each terminal passage of the connector, wherein continuity is impossible unless the terminals are properly at their locked position. For final ring out, a plurality of stabilizer pins of the holder enter stabilizer pin openings of the connector to provide terminal position stability during testing.

8 Claims, 5 Drawing Sheets

Fig. 9 ts and more particularly to ring out systems for testing electrical connectors during manufacture. Still more particularly, the present invention relates to a ring out system which provides assured indication of proper terminal placement in an electrical connector.

RING OUT SYSTEM PROVIDING TERMINAL POSITION ASSURANCE

TECHNICAL FIELD

The present invention relates to electrical connector test systems, and more particularly to ring out systems for testing electrical connectors during manufacture. Still more particularly, the present invention relates to a ring out system which provides assured indication of proper terminal placement in an electrical connector.

BACKGROUND OF THE INVENTION

Ring out systems are used to test insertion location of terminals in electrical connectors during building, commonly referred to in the art as a "build ring out" and/or at post assembly, commonly referred to in the art as a "final ring out". In this regard, an electrical connector has located therein one or more electrical terminals, and the proper insertion position of each terminal is tested by the electrical connector being inserted into a ring out holder, wherein if a ring out pin of the ring out holder contacts the terminal, the continuity thereby provided results in an assumption that the terminal will also mate with a male blade (or pin), and have continuity, therewith when the electrical connector is in actual operation.

Figure 1:
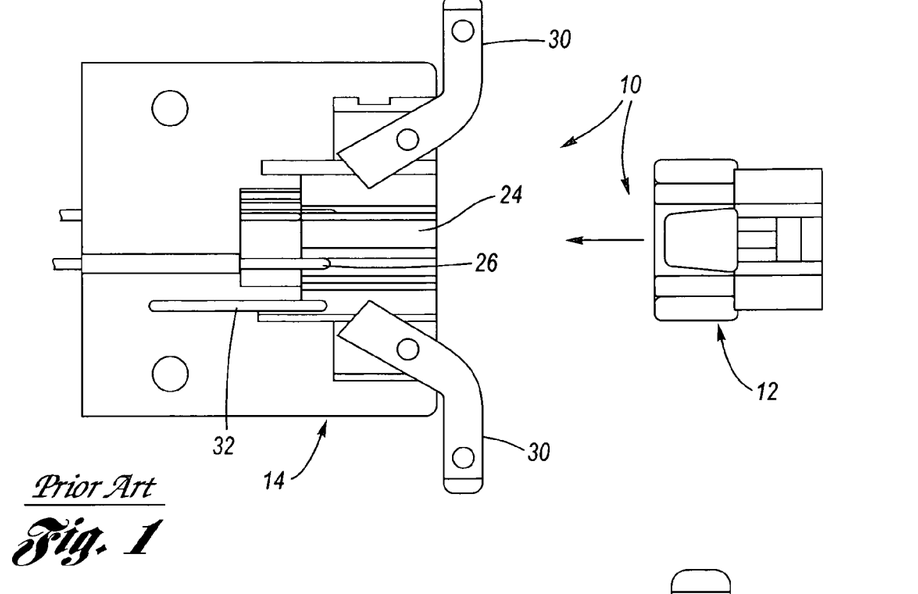
FIG. 1 is a partly sectional, exploded view of a prior art ring out system, including a prior art ring out holder and a prior art electrical connector.
Figure 2:
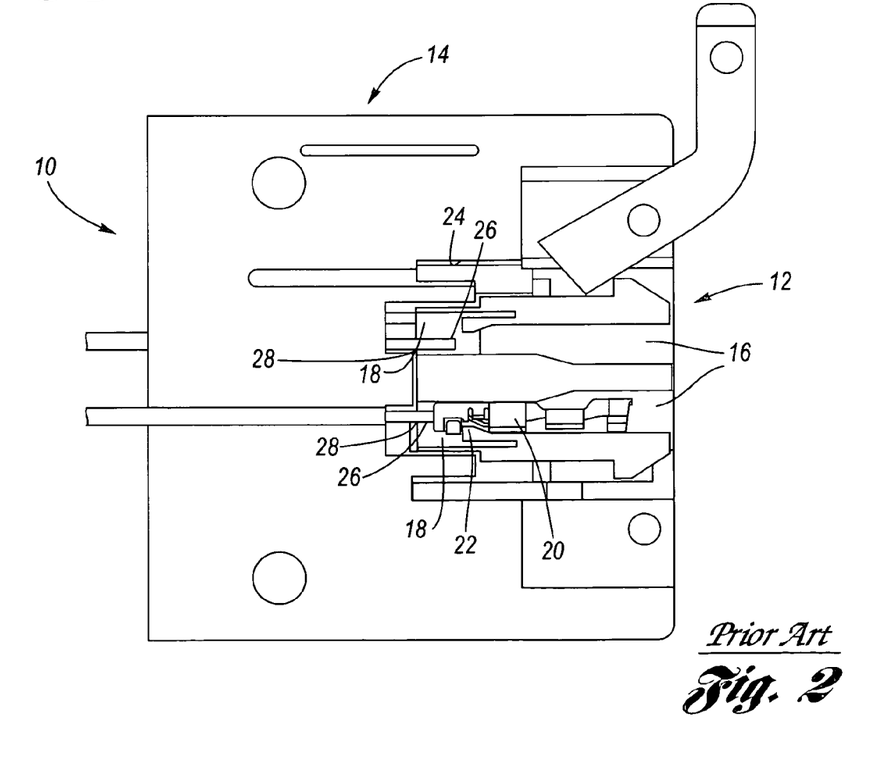
FIG. 2 is a partly sectional view of the prior art ring out system of FIG. 1, wherein now the prior art electrical connector is shown seated in a receptacle of the prior art ring out holder.

FIGS. 1 and 2 illustrate the structure and function of a prior art ring out system 10 with respect to an electrical connector 12 and a ring out holder 14. In the example shown, the electrical connector 12 is conventional, having a plurality of terminal passages 16 therein, each terminal passage including a respective terminal seat 18. As a terminal 20 is inserted into its respective terminal passage, it becomes locked on a flexible arm 22 in parallel alignment with the terminal passage (passage axis), now trappingly abutting a forward face of the flexible arm. The ring out holder 14 has a receptacle 24 of predetermined shape to allow it to receive therewithin the electrical connector 12, and further has a plurality of ring out pins 26, one ring out pin for each terminal 20, which protrude in a spring biased retractable manner into the receptacle 24. Each ring out pin is generally positioned in the ring out holder 14 so that it will be centrally disposed with respect to its respective terminal passage 16 and, therefore, be enabled to pass through its respective male blade opening 28 and thereby make contact with the terminal provided the terminal 20 is at its proper insertion location (whether or not it is in its properly locked position, as will be discussed below).

In operation during a build ring out, the electrical connector is received into the receptacle of the ring out holder, whereupon the ring out pins pass through the male blade openings. Next, building proceeds with each terminals being inserted into its respective terminal passage of the connector so as to be seated therein as best able. The ring out pins make contact, and therefore electrical continuity, with respective terminals, only if each of the terminals is located at a proper insertion location of its respective terminal passage. In this regard, selectively releasable lock arms 30 hold the electrical connector in the receptacle and locating pins 32 interface with the electrical connector to assure proper relative orientation therebetween. If continuity is not established at any of the terminals, then the connector is removed and checked for a terminal insertion location problem.

In operation during a final ring out, each of the terminals is inserted into its respective terminal passage of the connector so as to be seated therein as best able. The electrical connector is then received into the receptacle of the ring out holder, whereupon the ring out pins pass through the male blade openings and make contact, and therefore electrical continuity, with respective terminals only if each of the terminals is located at a proper insertion location of its respective terminal passage. If continuity is not established at any of the terminals, then the connector is removed and checked for a terminal insertion location problem.

While it is the case the prior art ring out system is capable of determining if a terminal has a proper insertion location in its respective terminal passage of an electrical connector, there is an absence of ability to ascertain whether, even if the terminal is inserted sufficiently to get continuity, whether the terminal is insufficiently inserted (underplugged), such as to be improperly positioned with respect to being seated in the terminal passage (ie., not in its proper locked position).

Additionally, it is important to note at the prior art ring out system is intended to accommodate total variations in the connector and its one or more terminals. In this regard, the ring out pins are set-up to take into consideration all possible tolerance stacks from minimum to maximum, wherein the typical connector-terminal mating is done in a straight axis plug allowing the terminal to ring prior to being fully seated due to over travel designed into the ring out pins such that the terminal can be unseated and yet ring as a good part, even when it is not.

Therefore, what remains needed in the art is a ring out system that tests for proper lock position of each terminal within its respective terminal passage of an electrical connector.

SUMMARY OF THE INVENTION

The present invention is a ring out system in which the ring out holder and the electrical connectors tested therewith are adapted to provide positive assurance of both proper insertion location and proper locked position of each terminal with respect to its terminal passage of the electrical connector. The positive terminal position assurance ring out system according to the present invention includes a ring out holder having a receptacle adapted for receiving thereinto electrical connectors for testing the position of terminals therewithin.

Each electrical connector has a plurality of terminal passages therein, each terminal passage including a respective terminal seat and a lock ramp. A terminal is inserted into its respective terminal passage, and in so doing becomes out of parallel alignment with the terminal passage as it passes over a lock ramp, but then drops into its terminal seat, now being again in parallel alignment with a passage axis of the terminal passage so as to now trappingly abut a forward face of the lock ramp. The electrical connector has formed therein a ring out pin opening for each terminal passage which communicates with the terminal passage at the floor thereof in spaced relation with respect to the male blade opening thereof.

Each of the final and build ring out holders according to the present invention has a receptacle of predetermined shape to allow it to receive therewithin the electrical connectors, and further has a plurality of ring out pins, one ring out pin for each terminal passage, which protrude in a spring biased retractable manner (in the case of the final ring out holder), or fixed position manner (in the case of the build ring out holder), into the receptacle. Each ring out pin is generally positioned in the ring out holder so that it will be centrally disposed with respect to its respective ring out pin opening and thereby make contact with the terminal if, and only if, the terminal is at its proper insertion location and at its proper locked position.

An additional feature of the final ring out holder and the electrical connectors according to the present invention is stabilization of the locked position of the electrical terminal therewithin when the electrical connector is received in the receptacle of the final ring out holder, wherein at least one stabilizer pin is affixed to the ring out holder so as to protrude into the receptacle. The electrical connector has corresponding stabilizer pin openings for receiving each respective stabilizer pin when the connector is received into the receptacle of the final ring out holder. In this regard, each terminal passage has a flexible arm which is provided stiffening when a stabilizer pin is present in an adjacent stabilizer pin opening into which the stabilizer pin is received, wherein, for example, a terminal pin is disposed betwixt an opposing pair of terminal cavities. As a consequence of the stabilizer pins, each terminal is positively located in its locked position for the continuity test with the ring out pins of the final ring out holder.

In operation during a build ring out, the electrical connector is received into the receptacle of the ring out holder, and during build, each of the terminals is inserted into its respective terminal passage of the electrical connector so as to be seated therein as best able. The ring out pins which are fixed in position and extend through the ring out pin openings, make contact, and therefore electrical continuity, with respective terminals, if, and only if, each of the terminals is both located at an insertion location and at its locked position in seated parallel relation to its passage axis, in abutting relation to the lock ramp of its respective terminal passage. This result occurs because the ring out pin is adjacent the floor of the terminal passage, and only if the terminal has cleared the lock ramp and then dropped into its proper locked position, not only being at its proper insertion location, can the ring out pin make contact therewith. If continuity is not established at any of the terminals, then the connector is removed and checked for a terminal position problem.

In operation during a final ring out, the electrical connector has already been built in that each of the terminals has already been inserted into its respective terminal passage of the electrical connector so as to be seated therein as best able. As a final test, the connector is then received into the receptacle of the ring out holder, whereupon the stabilizer pins pass through the stabilizer pin openings and the ring out pins pass through the ring out pin openings. Thereupon, the ring out pins make biasably retractable contact, and therefore electrical continuity, with respective terminals, if, and only if, each of the terminals is both located at the proper insertion location and at the proper locked position in seated parallel relation to the passage axis in abutting relation to the lock ramp of its respective terminal passage. This result occurs because the ring out pin is adjacent the bottom of the terminal passage, and only if the terminal has cleared the lock ramp and then dropped into its proper locked position, not just its proper insertion location, can the ring out pin make contact therewith. In this regard, the stabilizer pins provide position assurance that the terminals will remain in their proper locked positions during testing. If continuity is not established at any of the terminals, then the connector is removed and checked for a terminal position problem.

Accordingly, it is an object of the present invention to provide a ring out system in which the ring out holder and the electrical connectors tested therewith are adapted to provide positive assurance of both proper insertion location and proper locked position of each terminal with respect to its terminal passage of the electrical connector.

This and additional objects, features and advantages of the present invention will become clearer from the following specification of a preferred embodiment.

DESCRIPTION OF THE PREFERRED EMBODIMENT

Referring now to the Drawing, FIGS. 2 through 9 depict various aspects of a positive terminal position assurance ring out system 100, 100' according to the present invention.

FIGS. 3 through 6 depict a positive terminal position assurance ring out system 100 according to the present invention suited for a final ring out, including a final ring out holder 102 and an electrical connector 104 to be tested therewith which is adapted to provide positive assurance of both proper insertion location and proper locked position of each terminal 104 with respect to its terminal passage 106 after building of the electrical connector.

The electrical connector 104 has a plurality of terminal passages 106 formed therein, wherein each terminal passage has a passage axis A and includes a respective terminal seat 108 characterized by a floor 108a oriented parallel to the passage axis, an opposing flexible beam 108b oriented parallel to the passage axis, a passage forward end 108c oriented normal to the passage axis, and a forward face 108d of a lock ramp 110, wherein the forward face is oriented normal to the passage axis and the lock ramp has a ramp surface 110a oriented acutely with respect to the passage axis. The forward end 108c of each terminal passage has formed therein a ring out pin opening 112 which communicates in parallel relation with the terminal passage adjacent the floor 108a thereof, in spaced relation with respect to the male blade opening 115 thereof. Each terminal passage 106 has adjacent its flexible beam 108b a stabilizer pin opening 114 oriented parallel to the passage axis A which is not coincident with either the ring out pin opening 112 and the male blade opening 115. Preferably, a stabilizer pin opening 114 is disposed betwixt a pair of terminal passages 106.

Figure 3:
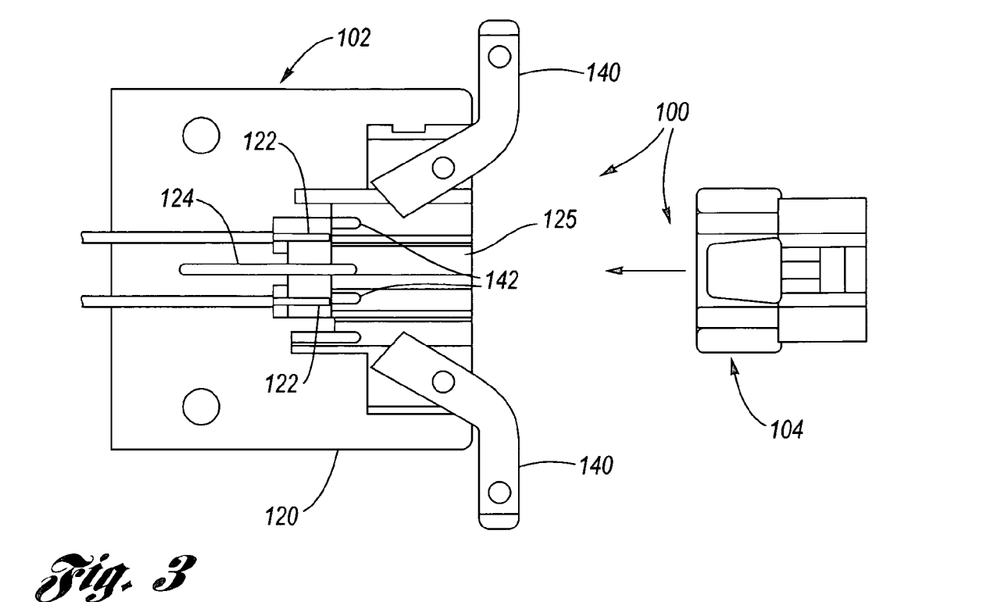
FIG. 3 is a partly sectional, exploded view of a positive terminal position assurance ring out system according to the present invention, including a final ring out holder and electrical connector.
Figure 4:
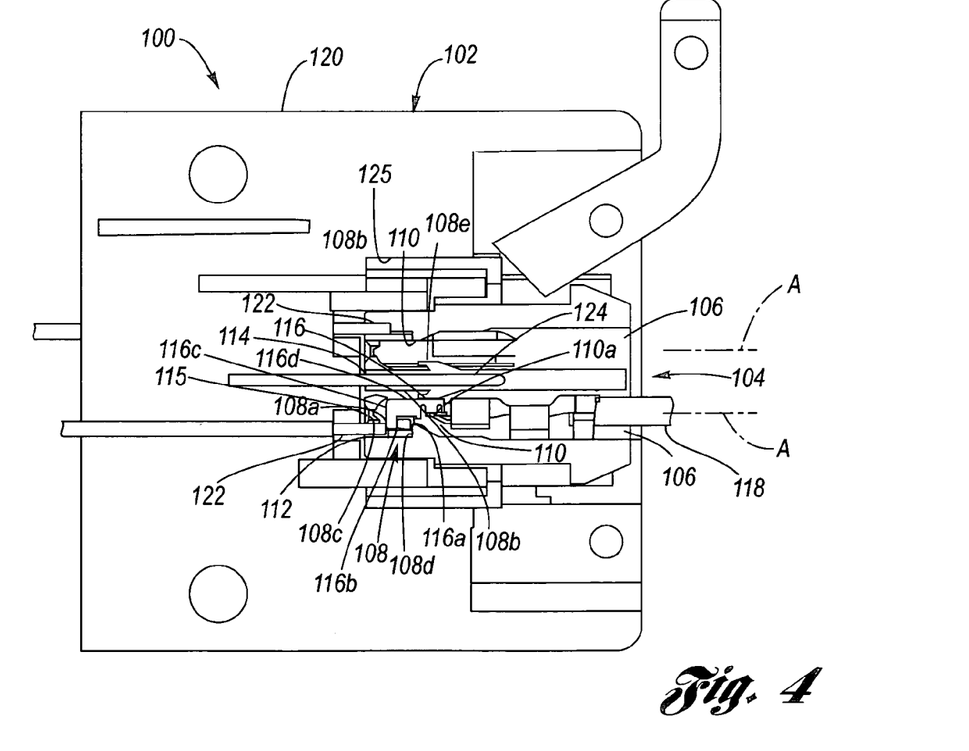
FIG. 4 is a partly sectional view of the positive terminal position assurance ring out system of FIG. 3, wherein now the electrical connector is shown seated in a receptacle of the final ring out holder.

A terminal 116, having at least one associated wire 118, is inserted into its respective terminal passage 106. The terminal 116 includes a head having a lock face 116a, a floor face 116b, a forward face 116c and a beam face 116d. During the insertion process of the terminal 116 into it respective terminal passage, the terminal becomes out of parallel alignment with the passage axis A as it passes over a lock ramp 110, and then drops seatingly into the terminal seat 108, urged by a terminal biasing ramp 108e of the flexible beam 108b. Now, the terminal is again in parallel alignment with the passage axis A and the lock face 116a is trapped abutting the forward face 108d of the lock ramp 110.

Figure 5:
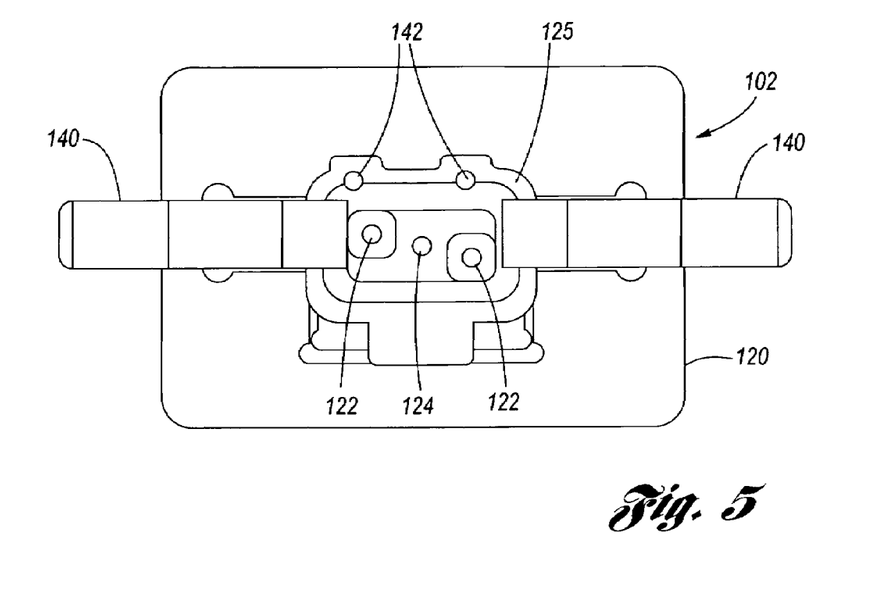
FIG. 5 is a front end plan view of the final ring out holder according to the present invention, showing in particular the receptacle, ring out pins, and stabilizer pin thereof.

The final ring out holder 102 has a holder body 120 having formed therein a receptacle 125 of predetermined shape to thereby allow it to receive therewithin the electrical connector 104. The holder body 120 has a plurality of ring out pins 122, one ring out pin for each terminal passage 106 which protrude in a spring biased retractable manner (well known in the art) into the receptacle and, for example, pass out the rear side of the holder body, or otherwise be configured, so as to be connectable to a test electrical circuit. Each ring out pin 122 is generally positioned in the holder body 120 so that it will be centrally disposed with respect to its respective ring out pin opening 112 and thereby make contact with the terminal 116 only if the terminal is at its proper insertion location and at its proper locked position. Additionally, the holder body 120 further has a fixed stabilizer pin 124 for being received into each stabilizer pin opening 114 and thereby stabilize the proper locked position of the terminal with respect to its respective flexible beam 108b.

In operation during a final ring out, the electrical connector 104 has already been built in that each of the terminals 116 has already been inserted into its respective terminal passage 106 of the electrical connector so as to be seated therein as best able. As a final test, the connector is then received into the receptacle 125 of the ring out holder 102, whereupon the stabilizer pins 124 pass through the stabilizer pin openings 114 and the ring out pins 122 pass through the ring out pin openings 112. The ring out pins 122 are biasably retractable as they contact, and therefore provide electrical continuity, with respective terminals, if, and only if, each of the terminals is both located at the proper insertion location and at the proper locked position in seated parallel relation to the passage axis and in abutting relation to the lock ramp of its respective terminal passage. This result occurs because the ring out pin is adjacent the bottom of the terminal passage, and only if the terminal has cleared the lock ramp and then dropped into its proper locked position, not just its proper insertion location, can the ring out pin make contact therewith. If continuity is not established at any of the terminals, then the connector is removed and checked for a terminal position Referring now to FIGS. 6 through 8, a positive terminal position assurance ring out system 100' according to the present invention suited for a build ring out is depicted, including a build ring out holder 102' and the aforementioned electrical connector 104 of FIG. 6 to be tested therewith which is adapted to provide positive assurance of both proper insertion location and proper locked position of each terminal 104 with respect to the terminal seat 108 of its terminal passage 106 of each terminal during building of the electrical connector.

Figure 6:
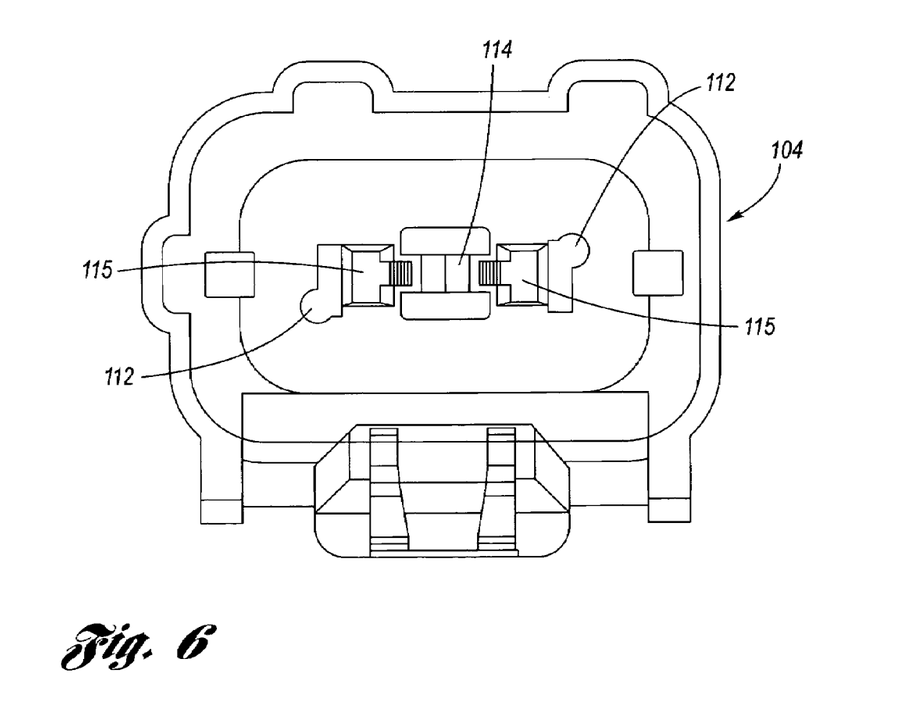
FIG. 6 is a front end plan view of the electrical connector according to the present invention, showing in particular the ring out pin openings, stabilizer pin opening, and male blade openings thereof.

The electrical connector 104 is as described hereinabove with respect to FIG. 6, and no further discussion is necessary, except to mention that for purposes of build testing only, the stabilizer pin openings 114 may optionally be obviated. Further, the terminal 116 is as described hereinabove, having at least one associated wire 118, is insertable into its respective terminal passage 106. The terminal 116 includes, as described above, a head having a lock face, a floor face, a forward face, and a beam face.

Figure 7:
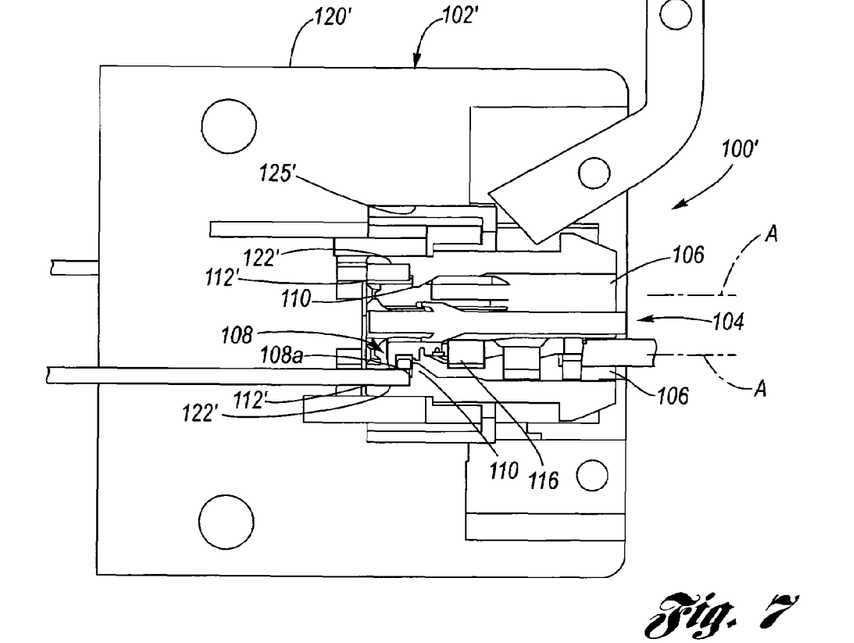
FIG. 7 is a partly sectional view of the positive terminal position assurance ring out system in which an electrical connector is shown seated in a receptacle of a build ring out holder.
Figure 8:
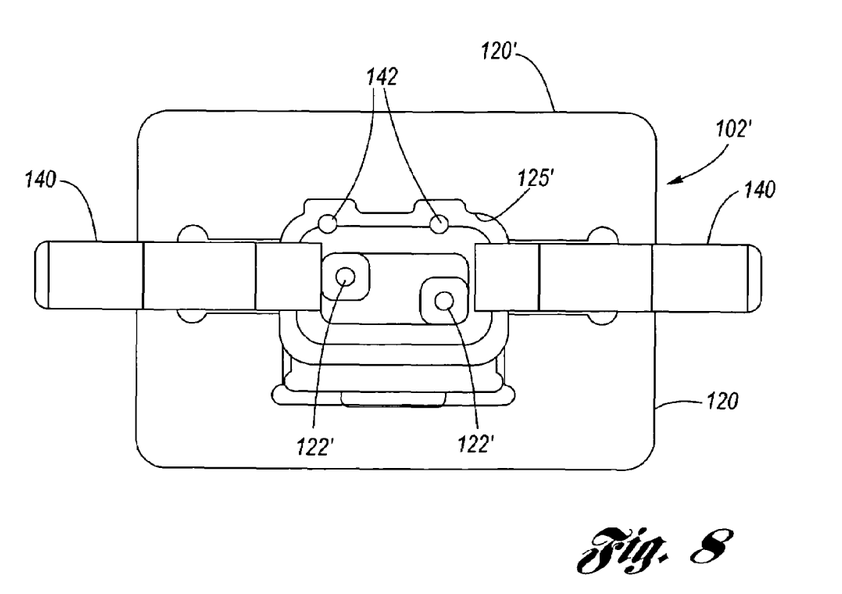
FIG. 8 is a front end plan view of the build ring out holder according to the present invention, showing in particular the receptacle and ring out pins thereof.

The build ring out holder 102' has a holder body 120' having formed therein a receptacle 125' of predetermined shape to thereby allow it to receive therewithin the electrical connector 104. The holder body 120' has a plurality of ring out pins 122', one ring out pin for each terminal passage 106 which protrude in a fixed position manner into the receptacle and, for example, pass out the rear side of the holder body, or are otherwise configured, so as to be connectable to a test electrical circuit. Each ring out pin 122' is generally positioned in the holder body 120' so that it will be centrally disposed with respect to its respective ring out pin opening 112' and thereby make contact with the terminal 116 only if the terminal is at its proper insertion location and at its proper locked position.

In operation during a build ring out, the electrical connector 112 is received into the receptacle 125' of the ring out holder 120', and during the build process, each of the terminals 116 is inserted into its respective terminal passage 106 of the electrical connector 104 so as to be seated therein as best able. The ring out pins 122' which are fixed in position and extend through the ring out pin openings 112, make contact, and therefore electrical continuity, with respective terminals, if, and only if, each of the terminals is both located at the proper insertion location and at the proper locked position in seated parallel relation to the receptacle axis and in abutting relation to the lock ramp 110 of its respective terminal passage. This result occurs because the ring out pin is adjacent the floor 108a of the terminal seat 108, and only if the terminal has cleared the lock ramp and then dropped into its proper locked position, not just its proper insertion location, can the ring out pin make contact therewith. If continuity is not established at any of the terminals, then the connector is removed and checked for a terminal position problem.

Figure 9:
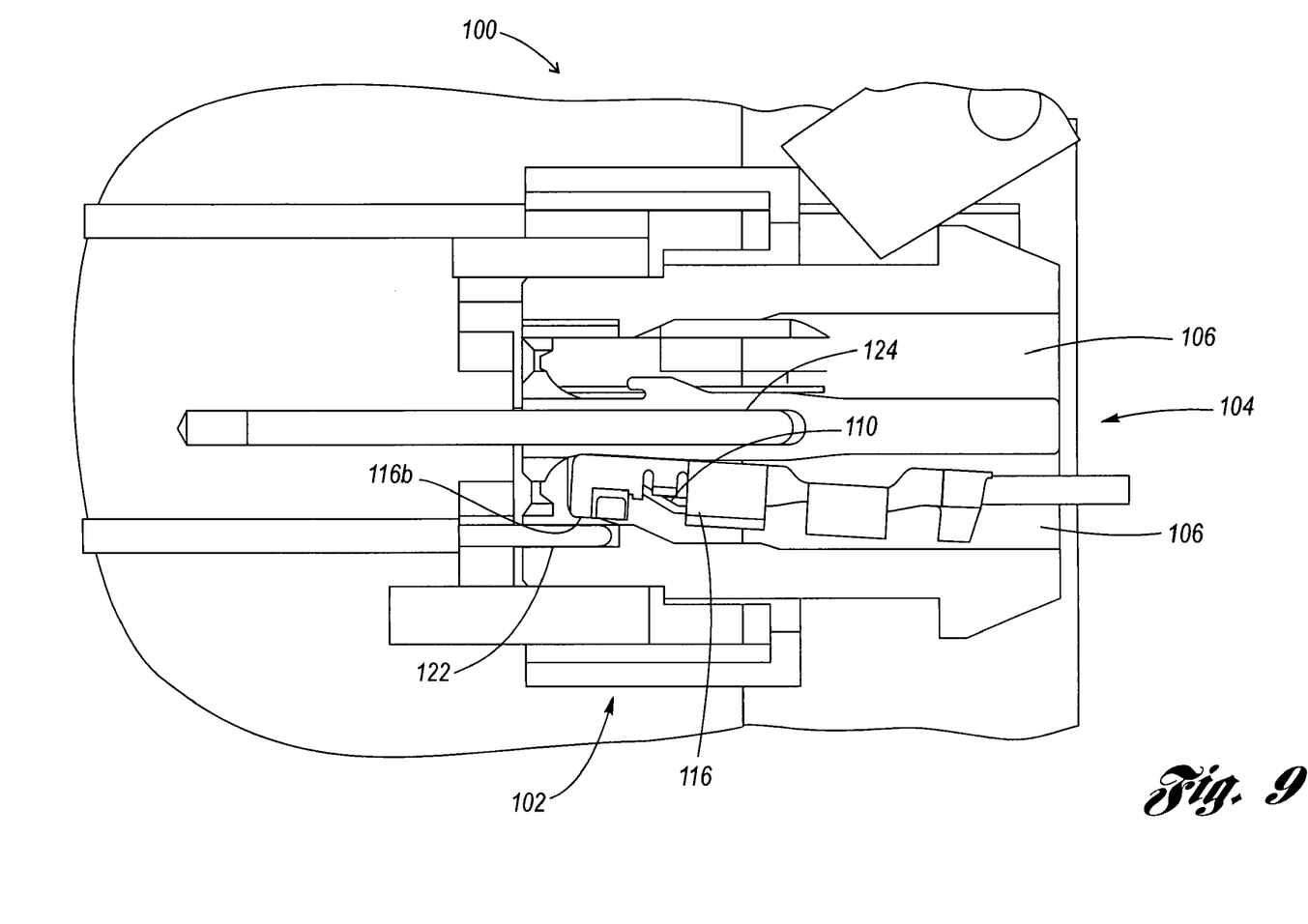
FIG. 9 is a is a partly sectional view of the positive terminal position assurance ring out system as in FIG. 4, except now there is detectable continuity fault, in that the terminal is not in its proper locked position so that continuity between the terminal and the ring out pin is absent.

FIG. 9 depicts a situation in which the positive terminal position assurance ring out system according to the present invention can detect when continuity is not established at any of the terminals. As can be seen, the terminal 116 is hung-up on the lock ramp 110, and even if inserted far enough into the terminal passage 106 that a prior art ring out system 10 would detect continuity and therefore would detect no fault in terminal seating, the positive terminal position assurance ring out system will have an absence of continuity because the floor face 116b of the terminal 116 is vertically separated from the ring out pin 122, and thereby will detect fault in the terminal seating.

By way of further description, the holder body 102, 102' preferably further includes a prior art mechanism to hold the electrical connector in the receptacle, as for example selectively releasable lock arms 140, and have locating pins 142 which interface with the electrical connector to assure proper relative orientation therebetween.

The stabilizer pin stabilizes the terminal in the terminal seat, making sure the terminal stays in continuity with the ring out pin. If the wires are dressed at certain angles, the terminal could rock freely/move in the terminal seat/passage, causing an intermitted continuity situation. The terminal could be underplugged, hung-up on the lock ramp and still get the stabilizer in its opening when plugging the connector into the ring out holder, albeit the flexible beam plastic would be slightly crushed. The stabilizer pin, therefore, provides terminal position stability.

To those skilled in the art to which this invention appertains, the above described preferred embodiment may be subject to change or modification. Such change or modification can be carried out without departing from the scope of the invention, which is intended to be limited only by the scope of the appended claims.

The invention claimed is:

1. A ring out system comprising a ring out holder and an electrical connector;
    said ring out holder comprising a ring out body-having a receptacle formed therein, and at least one ring out pin connected with said ring out body and projecting into said receptacle;
    said electrical connector comprising at least one terminal passage having a passage axis, a lock ramp and a terminal seat having a floor adjacent said lock ramp, a male blade opening formed at said terminal passage in substantial alignment with the passage axis, a ring out pin opening formed at said terminal passage and disposed substantially adjacent said floor of the terminal passage; and at least one terminal, said terminal being positioned in the terminal seat of a respective terminal receptacle;
    wherein said electrical connector is received into said receptacle, whereupon said ring out pin enters a respective ring out pin opening; and
    wherein when said electrical connector is received into said receptacle and each said ring out pin is received into its respective ring out pin opening, said terminal will have electrical continuity with its respective ring out pin provided the terminal is at a properly locked position with respect to said lock ramp defined by the terminal touching the ring out pin.

2. The system of claim 1, wherein said at least one ring out pin has a fixed position relative to said ring out holder body, and wherein said ring out holder is a build ring out holder wherein said electrical connector is first received into said receptacle before said at least one terminal is inserted into said at least one terminal passage.

3. A ring out system, comprising a ring out holder and an electrical connector;
    said ring out holder comprising a ring out body-having a receptacle formed therein and at least one ring out pin connected with said ring out body and projecting into said receptacle;
    said electrical connector comprising at least one terminal passage-having a passage axis, a lock ramp and a terminal seat having a floor adjacent said lock ramp, a male blade opening formed at said terminal passage in substantial alignment with the passage axis, and a ring out pin opening formed at said terminal passage and disposed substantially adjacent said floor of the terminal passage;
    wherein said electrical connector is received into said receptacle, whereupon said ring out pin enters a respective ring out pin opening;
    wherein said at least one terminal passage further has a flexible beam disposed opposite said floor;
    wherein said ring out holder has at least one stabilizer pin connected in fixed position with said holder body and projecting into said receptacle;
    wherein a stabilizer pin opening is formed in said electrical connector at the flexible beam of said at least one terminal; and
    wherein said electrical connector is received into said receptacle, whereupon each said stabilizer pin enters into a respective stabilizer pin opening.

4. The system of claim 3, further comprising:
    at least one terminal, each said terminal being positioned in the terminal seat of a respective terminal receptacle;
    wherein when said electrical connector is received into said receptacle and each said ring out pin is received into its respective ring out pin opening, each said terminal will have electrical continuity with its respective ring out pin provided the terminal is at a properly locked position with respect to said lock ramp defined by the terminal touching the ring out pin.

5. The system of claim 4, wherein said at least one ring out pin has a spring biased retractable relationship with respect to said ring out holder body, and wherein said ring out holder is a final ring out holder wherein said at least one terminal is first inserted into said at least one terminal passage before said electrical connector is received into said receptacle.

6. A ring out holder comprising:
    a ring out body having a receptacle formed therein;
    at least one ring out pin connected with said ring out body and projecting into said receptacle; and
    at least one stabilizer pin connected in fixed position with said holder body and projecting into said receptacle;
    said ring out holder being configured such that when an electrical connector is received into said receptacle and each said ring out pin is received into a respective ring out pin opening, each said ring out pin will have electrical continuity with a respective terminal provided the terminal is at a properly locked position.

7. An electrical connector, comprising:
    at least one terminal passage, each said terminal passage having a passage axis, a lock ramp and a terminal seat, said terminal seat having a floor adjacent said lock ramp;
    a male blade opening at each said terminal passage formed in said electrical connector substantial alignment with the passage axis thereof; and
    a ring out pin opening at each said terminal passage formed in said electrical connector disposed substantially adjacent said floor of the terminal passage thereof;
    wherein the male blade opening and the ring out pin opening of each said terminal passage are free of mutual coincidences;
    said electrical connector being configured such that when each said ring out pin opening receives a respective ring out pin, the ring out pin will brave electrical continuity with its respective terminal provided the terminal is at a properly locked position with respect to said lock ramp defined by the terminal touching the ring out pin.

8. An electrical connector, comprising:
    at least one terminal passage, each said terminal passage having a passage axis, a lock ramp and a terminal seat, said terminal seat having a floor adjacent said lock ramp;

a male blade opening at each said terminal passage formed in said electrical connector substantial alignment with the passage axis thereof; and a ring out pin opening at each said terminal passage formed in said electrical connector disposed substantially adjacent said floor of the terminal passage thereof;

wherein the male blade opening and the ring out pin opening of each said terminal passage are free of mutual coincidence;

wherein said at least one terminal passage further has a flexible beam disposed opposite said floor; said connector fever comprising:

a stabilizer pin opening formed in said electrical connector at the flexible beam of said at least one terminal;

wherein the stabilizer pin opening, male blade opening and the ring out pin opening of each said terminal passage are free of mutual coincidence.

* * * * *